US009537378B2

(12) United States Patent
Halicek

(10) Patent No.: US 9,537,378 B2
(45) Date of Patent: Jan. 3, 2017

(54) AUDIBLE WARNING SYSTEM FOR GENERATOR SYSTEM

(71) Applicant: Caterpillar Inc., Peoria, IL (US)

(72) Inventor: Miroslav Halicek, Peachtree City, GA (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 14/807,942

(22) Filed: Jul. 24, 2015

(65) Prior Publication Data
US 2015/0333601 A1 Nov. 19, 2015

(51) Int. Cl.
*H02K 11/00* (2016.01)
*H02H 3/00* (2006.01)
*G01R 31/34* (2006.01)

(52) U.S. Cl.
CPC .......... *H02K 11/20* (2016.01); *H02K 11/0052* (2013.01); *G01R 31/343* (2013.01); *H02K 2213/06* (2013.01)

(58) Field of Classification Search
USPC .............................................. 322/99; 361/42
See application file for complete search history.

(56) References Cited

U.S. PATENT DOCUMENTS

| 1,770,094 | A | 7/1930 | Wickersham |
| 4,733,175 | A | 3/1988 | Levinson |
| 5,023,747 | A | 6/1991 | Lindsay |
| 5,225,994 | A | 7/1993 | Arinobu et al. |
| 5,737,168 | A * | 4/1998 | Baker ................... H02H 3/207 361/84 |
| 5,825,599 | A * | 10/1998 | Rosenbaum ............. H02H 3/04 340/651 |
| 7,400,476 | B1 * | 7/2008 | Hull, Jr. ............... H02H 11/002 361/42 |
| 8,861,146 | B2 * | 10/2014 | McMahon ............. H01H 47/22 361/42 |
| 2005/0286184 | A1 * | 12/2005 | Campolo ............. H02H 1/0015 361/42 |
| 2007/0091520 | A1 * | 4/2007 | Angelides .............. H02H 3/335 361/42 |
| 2008/0204951 | A1 * | 8/2008 | Hull ..................... H02H 11/002 361/49 |

(Continued)

FOREIGN PATENT DOCUMENTS

| CN | 201490486 | 5/2010 |
| EP | 1022837 | 7/2000 |
| WO | 2014102445 | 7/2014 |

*Primary Examiner* — Pedro J Cuevas

(57) ABSTRACT

An audible warning system for a generator system is provided. The generator system includes a surge suppressor and a rectifier assembly. The rectifier assembly rotates along with the rotor of the generator system, and generates airflow. The surge suppressor includes a face portion. The audible warning system includes a mounting plate and an acoustic alarm device. The mounting plate is attached to the rectifier assembly to mount the surge suppressor and the acoustic alarm device. The acoustic alarm device includes an air inlet portion in engagement with a face portion of the surge suppressor. In operation, this arrangement blocks fluid communication of the airflow into the air inlet portion, in an operational state. A failure of the surge suppressor allows the airflow to pass through the air inlet portion to generate an audible alarm for an operator.

1 Claim, 5 Drawing Sheets

(56) References Cited

U.S. PATENT DOCUMENTS

2010/0118452 A1* 5/2010 Hull, Jr. ............... H02H 11/002
                                                            361/49
2012/0154972 A1* 6/2012 McMahon ............. H01H 47/22
                                                            361/187
2015/0043109 A1* 2/2015 McMahon ............. H01H 47/22
                                                            361/42

* cited by examiner

AUDIBLE WARNING SYSTEM FOR GENERATOR SYSTEM

TECHNICAL FIELD

The present disclosure generally relates to a detection system to find failure of surge suppressors within a generator system to protect against voltage. More particularly, the present disclosure relates to an audible warning system to notify a failure of the surge suppressor of the generator system.

BACKGROUND

A generator system (or a genset) generally converts mechanical energy to electrical energy and acts as a voltage source for a load. A generator system commonly includes a combination of a generator and a prime mover, such as an internal combustion engine. Conventionally, the generator may include a rotor, a stator, and an excitation system. The excitation system provides an exciter current to the rotor, which then rotates relative to the stator, and produces voltage. Typically surge suppressors are used to protect the excitation system of the generators. Surge suppressors are generally a pertinent requirement as modern electronics remain sensitive to power supply fluctuations. More specifically, surge suppressors are functional to protect the excitation system from electrical damage by suppression of voltage surges. In the event of an electrical surge, the surge suppressor is designed to fail, generally destructively. Since such surge suppressors are connected in shunt, the failure of the surge suppressors does not impact the operation of the generators. Upon such a failure, the surge suppressor may be incapable to protect the excitation system from further electrical surges. In such a case, the excitation system is exposed to electrical surges and remains vulnerable to potential damages. Hence, there may be a requirement to replace the surge suppressor timely. However, a failure of the surge suppressor is not easily detectable as the surge suppressor is typically installed on an interior portion of the generator system, which is generally inaccessible.

In case a failed surge suppressor is left unattended, and an operation of the generator system is continued, a further electrical surge may cause relatively significant damages to the excitation system. Moreover, this may lead to extensive repair of surrounding components, which may incur undue cost, effort, and machine downtime. Therefore, existing surge suppressors in excitation systems are supplemented with damage detection systems. Damage detection systems generally include alarm systems or devices which are electronically operated. However, these systems are dependent on an external power source, which makes the excitation system bulky, complex, and generally expensive to procure and maintain.

European Patent Publication Number 1,022,837 discloses a varistor connected across a power supply to protect an equipment against voltage spikes. In the '837 reference, a current leak through the varistor is monitored by a thermal sensor which functions in communication with a microchip. The microchip also receives input from an ambient temperature sensor, remote from the varistor. When the difference between the sensed temperatures exceeds a predetermined operating level, the microchip signals a warning. The '837 reference discusses a provision to assess the condition of the operational varistor through electronic components such as the thermal sensor, the microchip, an LED, and a tone generator. However, an installation of additional electronic components with the varistor may be a tedious task in case of the generator systems, where the varistors are installed in inaccessible locations.

The present disclosure seeks to address one or more of the problems associated with known.

SUMMARY OF THE INVENTION

Various aspects of the present disclosure relates to an audible warning system for a generator system. The generator system includes at least one surge suppressor and a rectifier assembly. The rectifier assembly is coupled to a rotor of the generator system. The rectifier assembly is operational to rotate along with the rotor of the generator system, which generates airflow. The at least one surge suppressor is coupled to the rectifier assembly. The at least one surge suppressor includes a face portion. The surge suppressor is functional to change from an operational state to a failed state, based on an overvoltage condition in the generator system. The audible warning system includes an acoustic alarm device and a mounting plate. The acoustic alarm device includes an air inlet portion in engagement with the face portion of the surge suppressor. In the operational state, the face portion of the surge suppressor blocks fluid communication of the airflow into the air inlet portion. The mounting plate is attached to the rectifier assembly. The mounting plate includes a first portion and a second portion. The first portion is structured to mount the surge suppressor. The second portion is structured to mount the acoustic alarm device, to direct the air flow towards the air inlet portion. A failure of the surge suppressor allows the airflow to pass through the air inlet portion of the acoustic alarm device. Thus, an audible alarm is generated.

DETAILED DESCRIPTION

Figure 1:
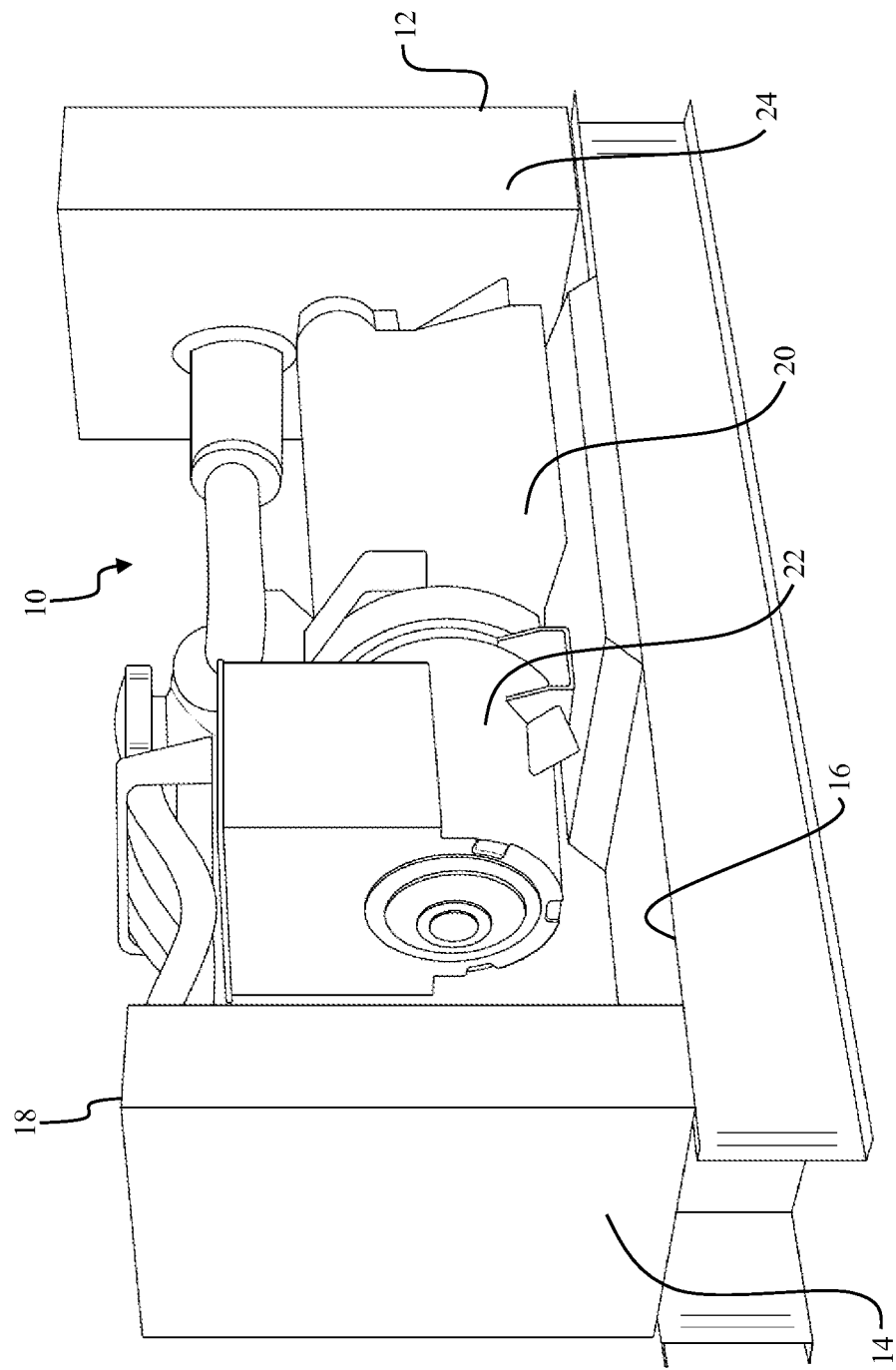
FIG. 1 is a perspective view of a generator system, in accordance with the concepts of the present disclosure.

Referring to FIG. 1, there is shown a generator system 10. The generator system 10 is hereinafter referred to as the genset 10. The genset 10 may be a part of a power system (not shown) configured to supply electricity to an external load.

The genset 10 includes a front end 12 and a rear end 14. The genset 10 includes a base frame 16, a generator terminal box 18, a prime mover 20, a generator 22, and a heat exchanger 24. The base frame 16 forms a mount for the generator terminal box 18, the generator 22, the prime mover 20, and the heat exchanger 24. The heat exchanger 24 is located at the front end 12. The heat exchanger 24 provides continuous circulation of cooling air. The heat exchanger 24 may include radiator, air to air after cooler, or the like.

The generator terminal box 18 is located at the rear end 14 and is connected to the generator 22. A rotor shaft 26 (FIG. 2) extends from the prime mover 20 and is drivingly coupled to the generator 22. The prime mover 20 may be a type of a heat engine operable to produce mechanical power by combustion of a mixture of air and fuel, which may include a diesel engine, a heavy fuel engine, a gasoline engine, and a gaseous fuel-powered engine.

The generator 22 may be a power-producing device mechanically coupled to receive power from the prime mover 20 and which converts at least a portion of that mechanical power into electricity. For example, the generator 22 may embody a three-phase high-voltage alternating current (AC) synchronous generator directly coupled to a crankshaft of the prime mover 20.

Figure 2:
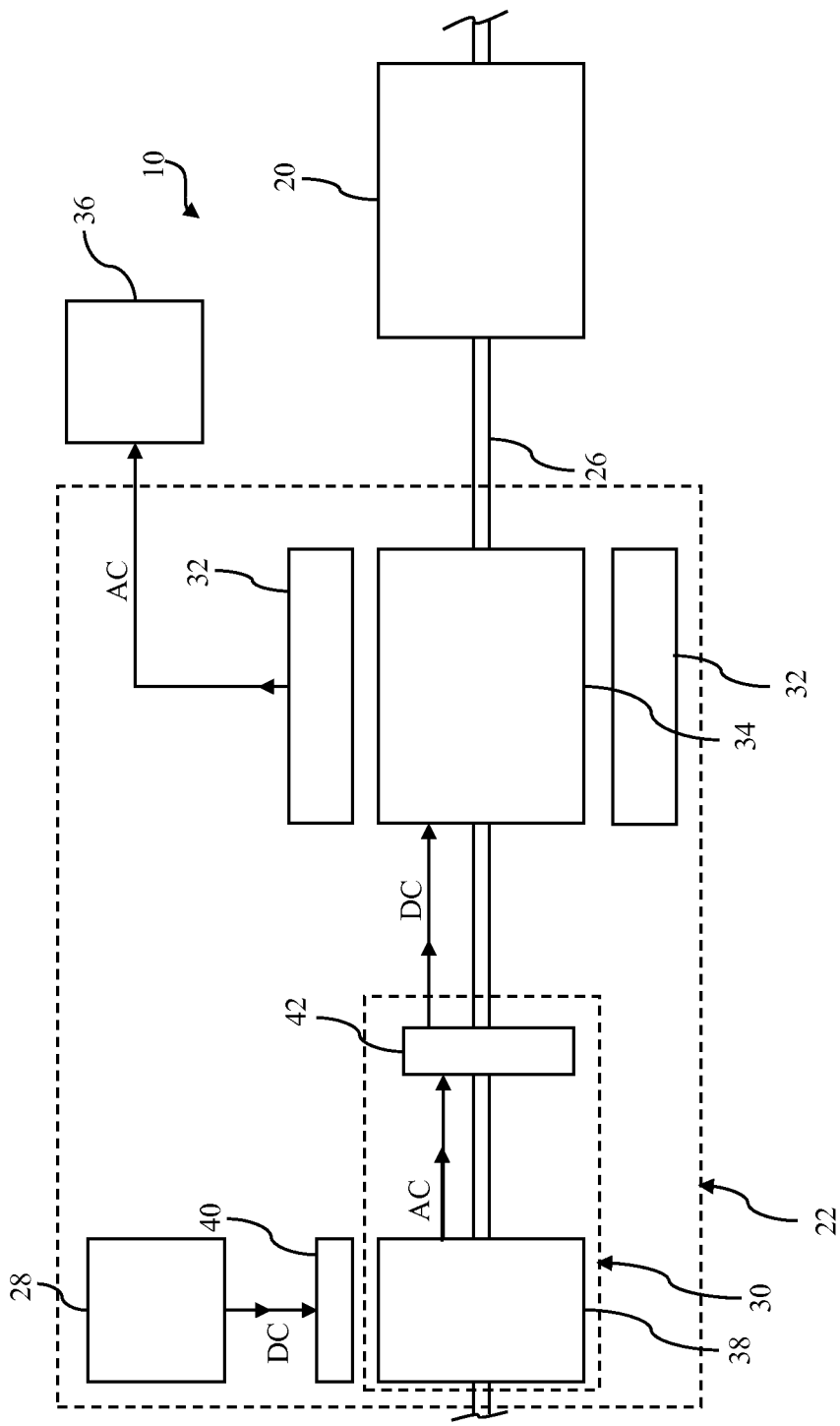
FIG. 2 is a schematic of the generator system of FIG. 1 in conjunction with an excitation system, in accordance with the concepts of the present disclosure.

Referring to FIG. 2, there is shown a schematic of the genset 10, which shows the generator components and the prime mover 20. The generator 22 includes a voltage regulator 28, an excitation system 30, a main stator 32, a main rotor 34, and an output load 36. The voltage regulator 28 may be connected to a permanent magnet stator (not shown) or an external power source (not shown), for supply of AC voltage to the voltage regulator 28. The voltage regulator 28 uses the AC voltage as a power supply and then converts the AC voltage to direct current (DC) voltage for output to the excitation system 30. The excitation system 30 is in electrical communication with the voltage regulator 28 for power supply.

The excitation system 30 includes an exciter rotor 38, an exciter stator 40, and a rectifier assembly 42. The exciter stator 40 is connected to the voltage regulator 28, which supplies the DC voltage as field supply to the exciter stator 40. The exciter stator 40 received DC current and generates magnetic fields. The exciter stator 40 is proximal to the exciter rotor 38.

The exciter rotor 38 is mounted on the rotor shaft 26. The exciter rotor 38 is provided for induction of an AC voltage generated by the magnetic fields of the exciter stator 40. This AC voltage is provided to the rectifier assembly 42. The rectifier assembly 42 is in electrical communication with the main rotor 34.

The main rotor 34 is defined as any rotating winding or rotating element, which functions as a rotating magnetic field when supplied with DC current (according to Faraday's law). The main rotor 34 is assembled on the rotor shaft 26. The main rotor 34 is in electrical communication with the excitation system 30. The main rotor 34 is surrounded by the main stator 32, with some gap defined between the main rotor 34 and the main stator 32. The main stator 32 is a stationary armature. The main stator 32 is in electrical communication with the output load 36.

Figure 3:
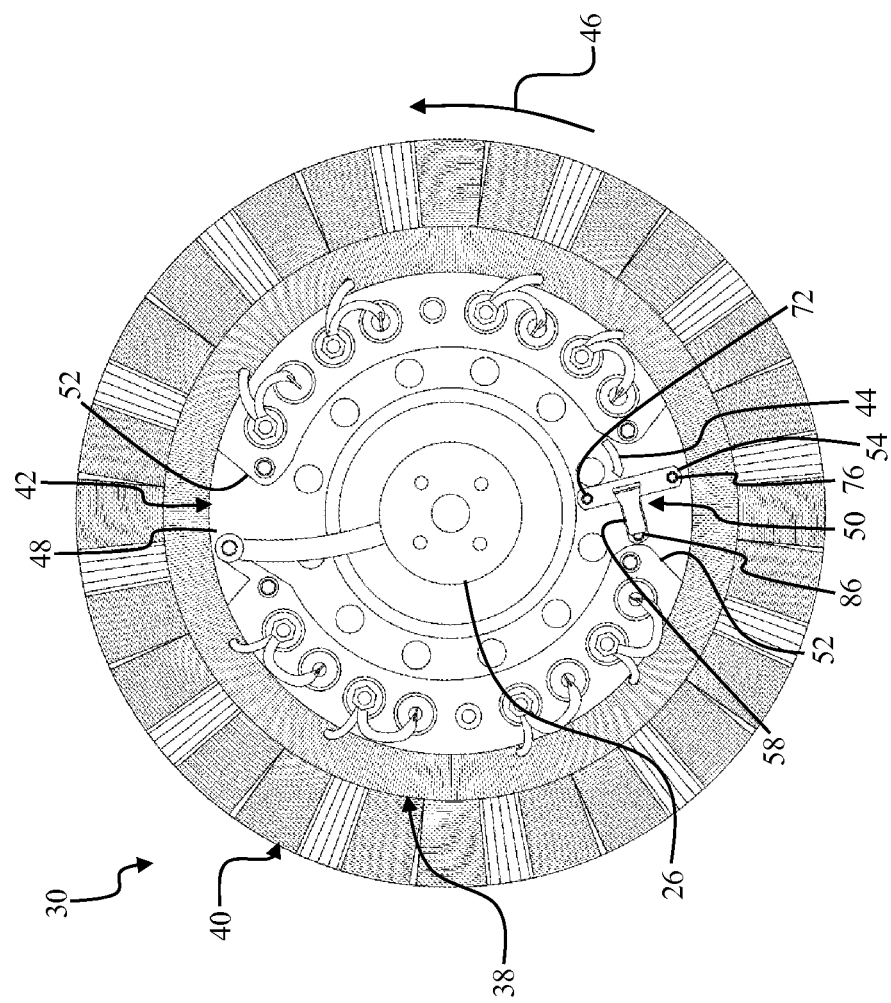
FIG. 3 is a front view of the excitation system of FIG. 2, in accordance with the concepts of the present disclosure.

Referring to FIG. 3, there is shown the exciter stator 40 of the excitation system 30. As shown, the exciter stator 40 surrounds the exciter rotor 38 and the rectifier assembly 42. The rectifier assembly 42 is generally a rotating assembly, which is coupled to the rotor shaft 26 and rotates with the main rotor 34 (FIG. 2). In so doing, the rectifier assembly 42 rotates along with the rotor shaft 26. A rotation of the rectifier assembly 42 generates airflow 44, in a direction 46 of rotation of the rectifier assembly 42. The rectifier assembly 42 is typically composed of components with the purpose to convert the AC voltage into DC voltage. The rectifier assembly 42 includes a rectifier base plate 48 and an audible warning system 50.

In the illustrated embodiment, the rectifier base plate 48 is circular in shape. The rectifier base plate 48 is structured to mount diode plates 52 and the audible warning system 50. As shown in FIG. 3, the audible warning system 50 is positioned on the rectifier base plate 48.

Figure 4:
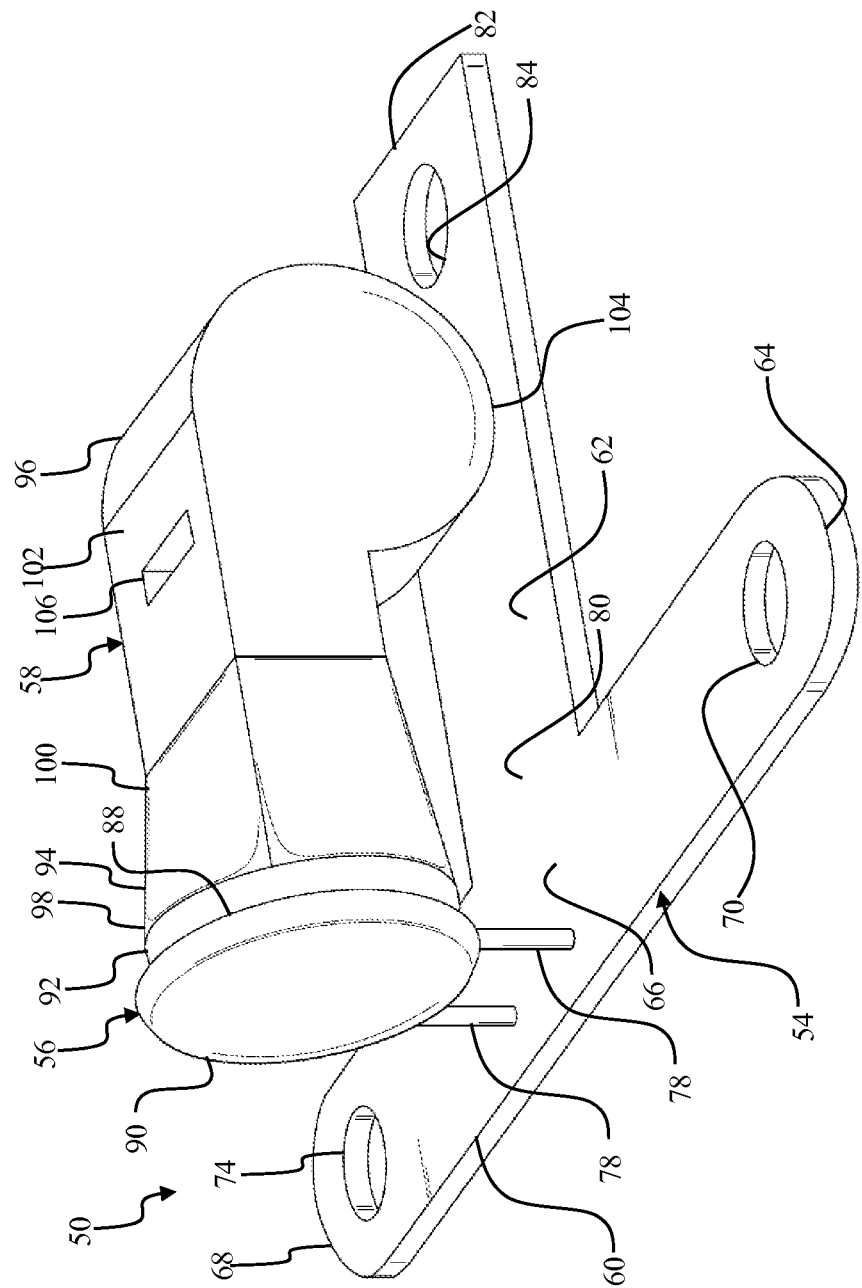
FIG. 4 is a perspective view of an audible warning system for the excitation system of FIG. 2, with a surge suppressor in an operational state, in accordance with the concepts of the present disclosure.

Referring to FIGS. 3 and 4, in the exemplary embodiment, the audible warning system 50 includes a mounting plate 54, a surge suppressor 56, and an acoustic alarm device 58. The mounting plate 54 is mounted onto the rectifier base plate 48. The mounting plate 54 includes a T-shaped metallic structure. The mounting plate 54 includes a first portion 60 and a second portion 62. The first portion 60 is a rectangular strip with substantially round corners, although the corners could be chamfered. The first portion 60 includes a first end 64, a middle portion 66, and a second end 68. The first end 64 includes a first hole 70 for attachment to the rectifier base plate 48, via a first fastener bolt 72. Similarly, the second end 68 includes a second hole 74 for attachment to the rectifier base plate 48, via a second fastener bolt 76. The middle portion 66 is defined between the first end 64 and the second end 68, to mount the surge suppressor 56, via two mounting structures 78 that may be conducting wire structures. The surge suppressor 56 is positioned substantially in a center area of the first portion 60.

The second portion 62 is a substantially rectangular strip which includes a first end 80 and a second end 82. The first end 80 is integrally attached to the middle portion 66, such that the second portion 62 is perpendicularly placed relative to the first portion 60. The second end 82 includes a third hole 84 for facilitating attachment of the mounting plate 54 to the rectifier base plate 48, via a third fastener bolt 86 (FIG. 3). The second portion 62 is equipped for mount of the acoustic alarm device 58, such that the acoustic alarm device 58 is directed towards the surge suppressor 56.

The surge suppressor 56 is designed to protect the excitation system 30 from voltage spikes. The surge suppressor 56 attempts to limit the DC voltage supplied to the main rotor 34 by blockage of unwanted voltages above a safe threshold level, which is a clamping voltage. The surge suppressor 56 is circular in shape and is arranged perpendicular relative to the first portion 60 of the mounting plate 54. The surge suppressor 56 is a voltage-dependent, variable resistor, or a metal oxide varistor. The surge suppressor 56 may be composed of sintered granular zinc oxide in a matrix of other metal oxides, positioned between two metal plates. The surge suppressor 56 includes a first face portion 88 and a second face portion 90, which are opposite of each other. The first face portion 88 is directed towards the acoustic alarm device 58. The second face portion 90 is directed towards the airflow 44 of the rectifier assembly 42. The surge suppressor 56 may shift from an operational state (FIG. 4) to a failed state (FIG. 5), based on an overvoltage condition in a generator circuit (not shown).

The acoustic alarm device 58 is illustrated as a whistle in FIGS. 3 and 4. The acoustic alarm device 58 is composed of plastic and may exhibit a mandolin-shaped structure. In the current embodiment, the acoustic alarm device 58 is glued to the mounting plate 54, which supports the structure of the acoustic alarm device 58. However, the acoustic alarm device 58 may be held in place by other means, such as a mounting bracket, a strap, a belt, and the like. The acoustic alarm device 58 includes an air inlet portion 92, a neck portion 94, and an end portion 96. The air inlet portion 92 is frustoconical in shape. The air inlet portion 92 is in engagement with the first face portion 88 of the surge suppressor 56. The air inlet portion 92 may include a periphery (not shown), which is glued to a rim of the first face portion 88 of the surge suppressor 56. This results in blockage of the surge suppressor 56 against the air inlet portion 92, in the operational state.

The neck portion 94 includes a first end 98 and a second end 100. The first end 98 is in communication with the air inlet portion 92. The neck portion 94 includes a conduit defined between the first end 98 and the second end 100, to allow passing of the air flowing through the air inlet portion 92. The second end 100 of the neck portion 94 is in fluid communication with the end portion 96.

The end portion 96 is glued to the second portion 62, to allow attachment of the acoustic alarm device 58 to the mounting plate 54. The end portion 96 includes a top portion 102 and a base portion 104. The end portion 96 also includes sound chambers (not shown), which allow the air to flow through then and exit the acoustic alarm device 58, thereby creating a sound. The top portion 102 is a flat surface and includes a rectangular slot 106. The rectangular slot 106 is provided for exhaust of air that flows into the neck portion 94, via the air inlet portion 92. The base portion 104 is circular or elliptical in shape and is glued in contact with the second portion 62 of the mounting plate 54. In an embodiment, the acoustic alarm device 58 may be a mechanical device that produces sound due to airflow 44 through the air inlet portion 92.

Figure 5:
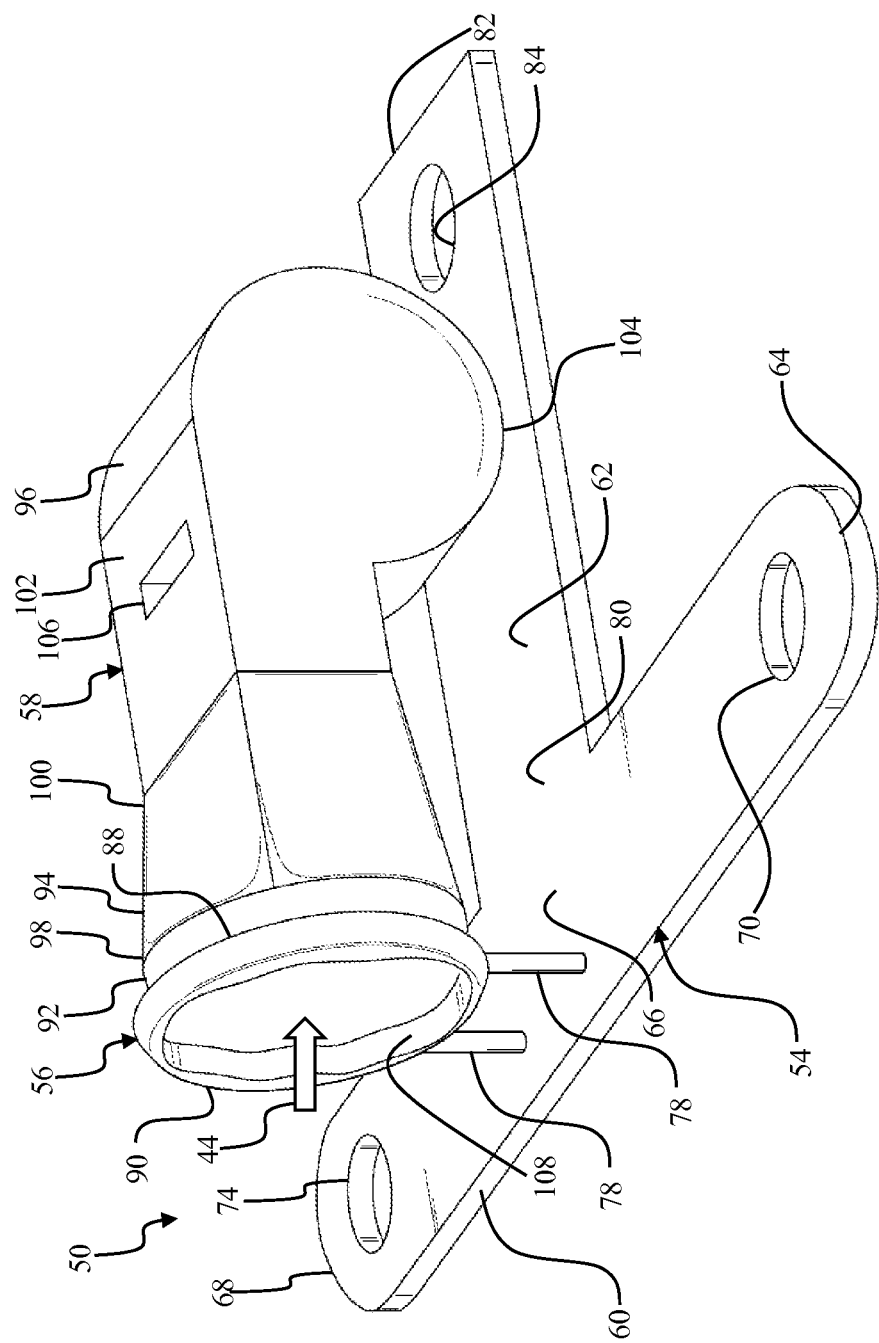
FIG. 5 is a perspective view of the audible warning system of FIG. 4, with the surge suppressor in a failed state, in accordance with the concepts of the present disclosure.

Referring to FIG. 5, there is shown the surge suppressor 56 in a failed state. In the failed state, the first face portion 88 and the second face portion 90 are destroyed, which results in formation of a cavity 108 in the surge suppressor 56. The cavity 108 allows the airflow 44 to enter the air inlet portion 92 of the acoustic alarm device 58.

INDUSTRIAL APPLICABILITY

In operation, for example, when the prime mover 20 starts to turn the rotor shaft 26 via a flexible coupling attached to the prime mover 20, the permanent magnet rotor (not shown) induces an AC voltage in the permanent magnet stator (not shown). Thereafter, the permanent magnet stator (not shown) provides an AC current to the voltage regulator 28. Hence, the voltage regulator 28 is powered. In another example, the voltage regulator 28 may be powered via the external power source (not shown). The voltage regulator 28 converts the AC voltage to DC voltage, which is supplied to the exciter stator 40 of the excitation system 30. This creates magnetic fields in the exciter stator 40. The magnetic fields of the exciter stator 40 induce an AC voltage in the exciter rotor 38. This AC voltage then flows to the rectifier assembly 42, for conversion from AC voltage to DC voltage, prior to supply to the main rotor 34. Upon supply of DC voltage to the main rotor 34, magnetic fields are generated in the main rotor 34. Generation of the magnetic fields in the main rotor 34 induces an AC voltage in the main stator 32. The main stator 32 then supplies the AC voltage to the output load 36.

The AC voltage that is supplied to the rectifier assembly 42 must be monitored to determine whether a line voltage in the generator circuit (not shown) is below the threshold level. When the line voltage is below the threshold level, the surge suppressor 56 is in the operational state. In the operational state, the surge suppressor 56 is intact and the first face portion 88 of the surge suppressor 56 is in engagement with the air inlet portion 92 of the acoustic alarm device 58. This blocks fluid communication of the airflow 44 to the air inlet portion 92. Thus, there is no alarm. However, when there is a voltage spike, or an electrical surge, the surge suppressor 56 fails such that the first face portion 88 and the second face portion 90 are ruptured and the cavity 108 is formed. This phenomenon paves way for the airflow 44 to penetrate the surge suppressor 56 via the cavity 108 and pass into the acoustic alarm device 58 through the air inlet portion 92. Entire portion of the air entering through the air inlet portion 92 exhausts through the rectangular slot 106. This results in creation of sound waves. Hence, an audible alarm is generated, in response to the airflow 44 being directed towards the acoustic alarm device 58 and an operator may be alerted to replace the failed surge suppressor 56.

As a location of the surge suppressor 56 is inaccessible, it is beneficial to apply the audible warning system 50 to detect the failed state of the surge suppressor 56. This helps the operator to replace the failed surge suppressor 56 timely, and hence, the flow of high DC voltage to the generator components is checked. Therefore, as there is notification for a replacement of the surge suppressor 56, components of the generator 22 are protected.

Advantageously, the disclosed audible warning system 50 is equipped with the acoustic alarm device 58, which is a mechanical device. Hence, there is negligible requirement of wirings and other electronic components, as is the case with typical electronic audible alarm devices. This makes the system generally less bulky and complex. Further, lesser costs are involved.

The many features and advantages of the disclosure are apparent from the detailed specification, and thus, are intended by the appended claims to cover all such features and advantages of the disclosure that fall within the true spirit and scope thereof. Further, since numerous modifications and variations will readily occur to those skilled in the art, it is not desired to limit the disclosure to the exact construction and operation illustrated and described herein. Accordingly, all suitable modifications and equivalents may be resorted to that fall within the scope of the disclosure.

What is claimed is:

1. An audible warning system for a generator system having at least one surge suppressor, and a rectifier assembly coupled to a rotor of the generator system, the rectifier assembly being operational to rotate along with the rotor of the generator system, thereby generating an airflow, the at least one surge suppressor being coupled to the rectifier assembly and having a face portion, wherein the surge suppressor being configured to change from an operational state to a failed state based on an overvoltage condition in the generator system, the audible warning system comprising:

an acoustic alarm device having an air inlet portion being in engagement with the face portion of the surge suppressor such that the face portion of the surge suppressor blocks fluid communication of the airflow into the air inlet portion, in the operational state; and a mounting plate attached to the rectifier assembly, the mounting plate including a first portion and a second portion, the first portion structured for mounting of the surge suppressor, the second portion structured for mounting of the acoustic alarm device such that the air flow is directed towards the air inlet portion, wherein a failure of the surge suppressor would allow the airflow to pass through the air inlet portion of the acoustic alarm device, thereby generating an audible alarm.

* * * * *